US009793097B2

(12) United States Patent
Spaulding et al.

(10) Patent No.: US 9,793,097 B2
(45) Date of Patent: Oct. 17, 2017

(54) TIME VARYING SEGMENTED PRESSURE CONTROL

(71) Applicant: Lam Research Corporation, Fremont, CA (US)

(72) Inventors: Kyle Spaulding, San Jose, CA (US); James Rogers, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/810,279

(22) Filed: Jul. 27, 2015

(65) Prior Publication Data
US 2017/0032943 A1   Feb. 2, 2017

(51) Int. Cl.
*C30B 25/14* (2006.01)
*C30B 25/16* (2006.01)
(Continued)

(52) U.S. Cl.
CPC .... *H01J 37/32834* (2013.01); *C23C 16/4412* (2013.01); *C23C 16/45589* (2013.01);
(Continued)

(58) Field of Classification Search
CPC .............................. C23C 14/50–14/505; C23C 16/45502–16/4551; C23C 16/45517; C23C 16/4552; C23C 16/45523; C23C 16/45557; C23C 16/45587; C23C 16/45589; C23C 16/45591; C30B 25/14; C30B 25/16–25/165; H01J 2237/16; H01J 2237/18–2237/1825; H01J 2237/3323; H01J 37/32091; H01J 37/32449; H01J 37/32568; H01J 37/32623–37/32651; H01J 37/32798–37/32807;
(Continued)

(56) References Cited

U.S. PATENT DOCUMENTS 5,281,274 A * 1/1994 Yoder ..................... C30B 25/02
                                                        118/697
6,178,919 B1   1/2001 Li et al.
(Continued)

FOREIGN PATENT DOCUMENTS

JP    WO 2014168096 A1 * 10/2014 ......... C23C 16/4412
KR       20030012565 A *  2/2003 ........... H01L 21/304
(Continued)

OTHER PUBLICATIONS

U.S. Appl. No. 14/553,439, filed Nov. 25, 2015.

*Primary Examiner* — Jeffrie R Lund
*Assistant Examiner* — Stanislav Antolin
(74) *Attorney, Agent, or Firm* — Beyer Law Group LLP

(57) ABSTRACT

An apparatus for processing a substrate is provided. A processing chamber is provided. A substrate support for supporting the substrate is within the processing chamber. A gas inlet provides gas into the processing chamber. An exhaust pressure system exhausts gas around a periphery of the substrate, wherein the periphery around the substrate is divided into at least three parts, wherein the exhaust pressure system controls exhaust pressure to control a velocity of the gas over the substrate, wherein the exhaust pressure system provides at independent exhaust pressure control for each part of the periphery for the at least three parts.

8 Claims, 8 Drawing Sheets

(51) Int. Cl.
*C23C 16/44* (2006.01)
*C23C 16/455* (2006.01)
*H01J 37/32* (2006.01)
*H01L 21/67* (2006.01)
*H01L 21/66* (2006.01)

(52) U.S. Cl.
CPC ............ *C30B 25/14* (2013.01); *C30B 25/165* (2013.01); *H01J 37/3244* (2013.01); *H01J 37/32091* (2013.01); *H01J 37/32816* (2013.01); *H01L 22/26* (2013.01); *H01J 2237/16* (2013.01)

(58) Field of Classification Search
CPC ....... H01J 37/32816–32/834; H01L 21/67069; H01L 21/67109; H01L 21/6719; H01L 21/68735; H01L 22/20–22/26
See application file for complete search history.

(56) References Cited

U.S. PATENT DOCUMENTS

| | | | | |
|---|---|---|---|---|
| 8,591,755 | B2 | 11/2013 | Dhindsa | |
| 2004/0067641 | A1* | 4/2004 | Yudovsky | C23C 16/4412 438/680 |
| 2005/0268850 | A1* | 12/2005 | Ma | H01J 37/32623 118/723 R |
| 2009/0061083 | A1* | 3/2009 | Chiang | C23C 16/45544 427/248.1 |
| 2010/0132614 | A1* | 6/2010 | Kato | C23C 16/402 118/723 R |
| 2011/0018158 | A1* | 1/2011 | Menard | H01L 24/74 264/101 |
| 2011/0174380 | A1* | 7/2011 | Itafuji | H01L 21/6719 137/1 |
| 2012/0031559 | A1* | 2/2012 | Dhindsa | H01J 37/32091 156/345.26 |
| 2012/0061350 | A1* | 3/2012 | Dhindsa | H01J 37/32935 216/59 |
| 2012/0094503 | A1* | 4/2012 | Shanker | C23C 16/04 438/761 |
| 2012/0156877 | A1* | 6/2012 | Yap | C23C 16/45565 438/689 |
| 2012/0289057 | A1* | 11/2012 | DeDontney | C23C 16/45519 438/758 |
| 2013/0045587 | A1* | 2/2013 | Kraus | H01L 21/02532 438/478 |
| 2013/0059448 | A1 | 3/2013 | Marakhtanov et al. | |
| 2013/0125818 | A1* | 5/2013 | Wright | C23C 16/54 118/723 R |
| 2013/0130490 | A1* | 5/2013 | Lee | C23C 16/04 438/597 |
| 2013/0152857 | A1* | 6/2013 | Wright | C23C 16/4482 118/715 |
| 2013/0153054 | A1* | 6/2013 | Child | B25B 11/005 137/343 |
| 2013/0153149 | A1* | 6/2013 | Wang | H01L 21/6719 156/345.51 |
| 2013/0171350 | A1* | 7/2013 | Kraus | C23C 16/303 427/255.28 |
| 2014/0124038 | A1* | 5/2014 | Mariserla | F17D 1/08 137/14 |
| 2015/0083582 | A1 | 3/2015 | Dhindsa et al. | |
| 2015/0361553 | A1* | 12/2015 | Murakawa | C23C 16/4412 156/345.55 |

FOREIGN PATENT DOCUMENTS

| KR | 20060020809 A | * | 3/2006 | ......... H01L 21/3065 |
|---|---|---|---|---|
| KR | 20100076098 A | * | 7/2010 | ............ H01L 21/00 |
| KR | 101050077 B1 | * | 7/2011 | ............ H01L 21/00 |

* cited by examiner

TIME VARYING SEGMENTED PRESSURE CONTROL

BACKGROUND

The present disclosure relates to plasma processing apparatus. More specifically, the present disclosure relates to a plasma processing apparatus for semiconductor processing.

During semiconductor wafer processing, a plasma processing chamber may be used to process a semiconductor wafer.

Information in this Background is not presumed to be prior art.

SUMMARY

To achieve the foregoing and in accordance with the purpose of the present disclosure, an apparatus for processing a substrate is provided. A processing chamber is provided. A substrate support for supporting the substrate is within the processing chamber. A gas inlet provides gas into the processing chamber. An exhaust pressure system exhausts gas around a periphery of the substrate, wherein the periphery around the substrate is divided into at least three parts, wherein the exhaust pressure system controls exhaust pressure to control a velocity of the gas over the substrate, wherein the exhaust pressure system provides at independent exhaust pressure control for each part of the periphery for the at least three parts.

In another manifestation, a method for processing a substrate in a processing chamber is provided. A gas is provided into the processing chamber above the substrate. The gas is flowed from above the substrate to a peripheral edge around the substrate. The exhaust pressure is varied in at least three discrete segments around the peripheral edge.

These and other features of the present invention will be described in more detail below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

A method and apparatus for injecting gas in a semiconductor processing apparatus, is described in "GAS INJECTION METHOD FOR UNIFORMLY PROCESSING A SEMICONDUCTOR SUBSTRATE IN A SEMICONDUCTOR SUBSTRATE PROCESSING APPARATUS," by James Rogers et al. filed on Nov. 25, 2014, as U.S. application Ser. No. 14/553,439, which is incorporated by reference for all purposes.

Figure 1:
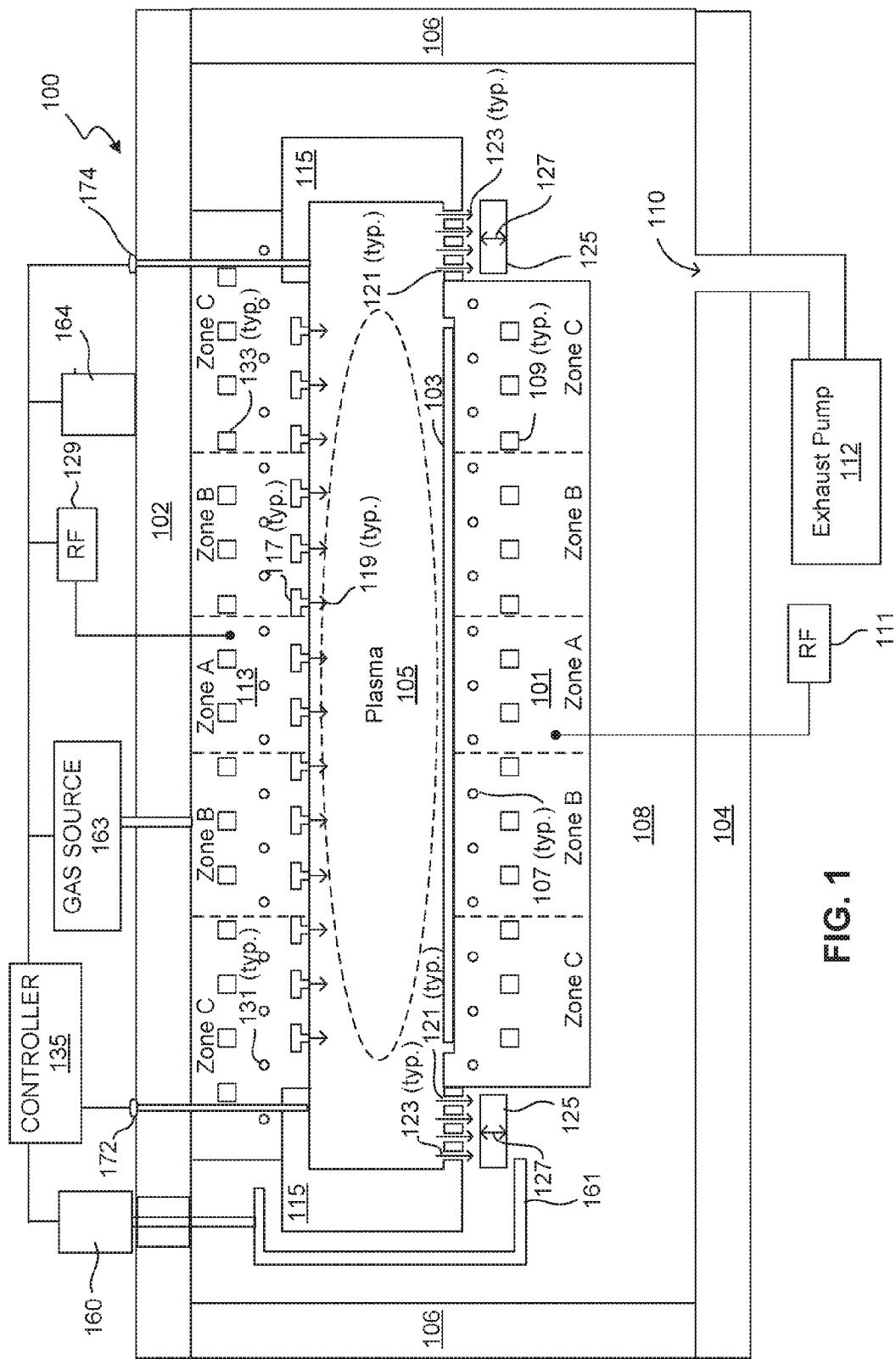
FIG. 1 is a schematic cross-sectional view of a plasma processing chamber.

To facilitate understanding, FIG. 1 is a schematic cross-sectional view of a plasma processing chamber 100, in accordance with one embodiment of the present invention. The chamber 100 is defined by a top plate 102, a bottom plate 104, and enclosing walls 106. An interior cavity 108 of the chamber 100 is fluidly connected to an exhaust port 110, which is connected to an exhaust pump 112, for removal of gases from the interior cavity 108. Within the chamber 100, an upper electrode assembly 113 is disposed above and spaced apart from a substrate holder 101. A peripheral shroud assembly 115 is defined between the upper electrode assembly 113 and the substrate holder 101 to form a peripheral boundary of a plasma generation volume 105 between the upper electrode assembly 113 and the substrate holder 101.

In one embodiment, process gases are flowed into the plasma generation volume 105 from a gas source 163 through ports 117 in the upper electrode assembly 113, as indicated by arrows 119. Also, in one embodiment, process gases are flowed out of the plasma generation volume 105 through ports 121 in the peripheral shroud assembly 115, as indicated by arrows 123, into the interior cavity 108 of the chamber 100, from which they can be exhausted through the exhaust port 110. In one embodiment, a pressure control ring system 125 is disposed proximate to the ports 121, and is movable in the direction 127 toward and away from the ports 121, to enable throttling of the fluid flow from the plasma generation volume 105 through the ports 121. A first motor 160 is connected by a first hangar 161 to the pressure control ring system 125, to move the pressure control ring system 125 in the direction 127. A second motor 164 is also shown. Also, in some embodiments, the process gas supply ports 117 in the upper electrode assembly 113 are defined in multiple concentric zones (e.g., Zones A, B, C in FIG. 1), with each zone having separate and independent capability with regard to process gas source and flow rate. It should be understood that the process gas supply and flow control configurations depicted in FIG. 1 are provided by way of example, and do not limit the principles of the invention disclosed herein.

The upper electrode assembly 113 is connected to a radiofrequency (RF) power source 129 and is defined to transmit RF power to the plasma generation volume 105. The RF power supplied to the upper electrode assembly 113 can be single frequency or multiple frequency. In other embodiments the upper electrode assembly 113 is not connected to an RF power source, but instead is grounded. In other embodiments the upper electrode assembly 113 is one or more inductive coils. The upper electrode assembly 113 also includes a number of heating elements 131 and a number of cooling elements 133. Different embodiments may have different electrode configurations. For example, in another embodiment instead of having power source 129, the upper electrode assembly 113 may be grounded.

Also, the heating elements 131 and/or cooling elements 133 of the upper electrode assembly 113 can be defined in multiple concentric zones, with each zone having separate and independent capability with regard to temperature control. For example, FIG. 1 shows three temperature control zones (Zones A, B, C) in the upper electrode assembly 113.

The substrate holder 101 is defined to hold a substrate 103, such as a semiconductor wafer, in exposure to the plasma generation volume 105. In one embodiment, the substrate holder 101 is connected to a radiofrequency (RF) power supply 111, so as to transmit RF power to the plasma generation volume 105. The RF power supply 111 can be either single frequency or multiple frequency. Also, in another embodiment, the substrate holder 101 can be connected to a reference ground potential. In one embodiment, the substrate holder 101 is defined as an electrostatic chuck (ESC).

Also, the heating elements 107 and/or cooling elements 109 of the substrate holder 101 can be defined in multiple concentric zones, with each zone having separate and independent capability with regard to temperature control. For example, the substrate holder 101 includes three temperature control zones (Zones A, B, C) that substantially match the temperature control zone configuration of the upper electrode assembly 113.

A controller 135 is used to control the plasma processing chamber 100. The controller 135 may be controllably connected to different parts of the plasma processing chamber such as the RF power source 129, the first motor 160, the second motor 164, and the gas source 163. The controller 135 may be controllably connected to other devices such as the exhaust pump 112, the lower RF power source 111, and the heating and cooling systems.

A plurality of pressure sensors 172, 174, such as manometers, are provided and connected to different parts of the plasma generation volume 105. The pressure sensors 172, 174 are connected to the controller 135. A feedback loop may use the pressure sensors 172, 174 and the pressure control ring system 125 to better control pressure and uniformity.

Figure 2:
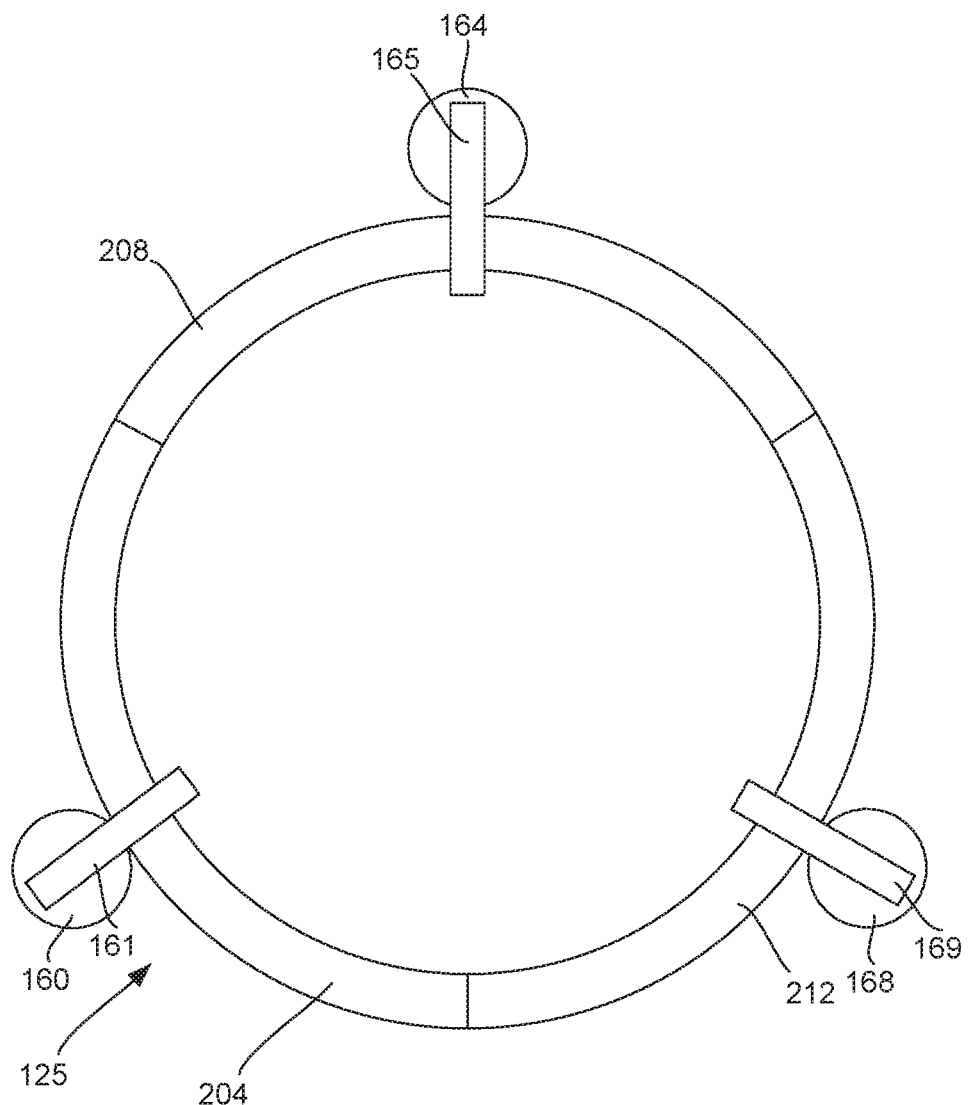
FIG. 2 is a bottom view of a pressure control ring system.

FIG. 2 is a bottom view of the pressure control ring system 125, which comprises a first segment 204, a second segment 208, and a third segment 212 for an entire pressure control ring. In this embodiment, the first segment 204 is moved by the first motor 160 and the first hangar 161, the second segment 208 is moved by the second motor 164 and a second hanger 165, and the third segment 212 is moved by a third motor 168 and a third hangar 169. The individual segments 204, 208, and 212 allow the segments to be independently moved to be in different positions. The motors 160, 164, 168 and hangers 161, 165, 169 form a drive system.

Figure 3A:
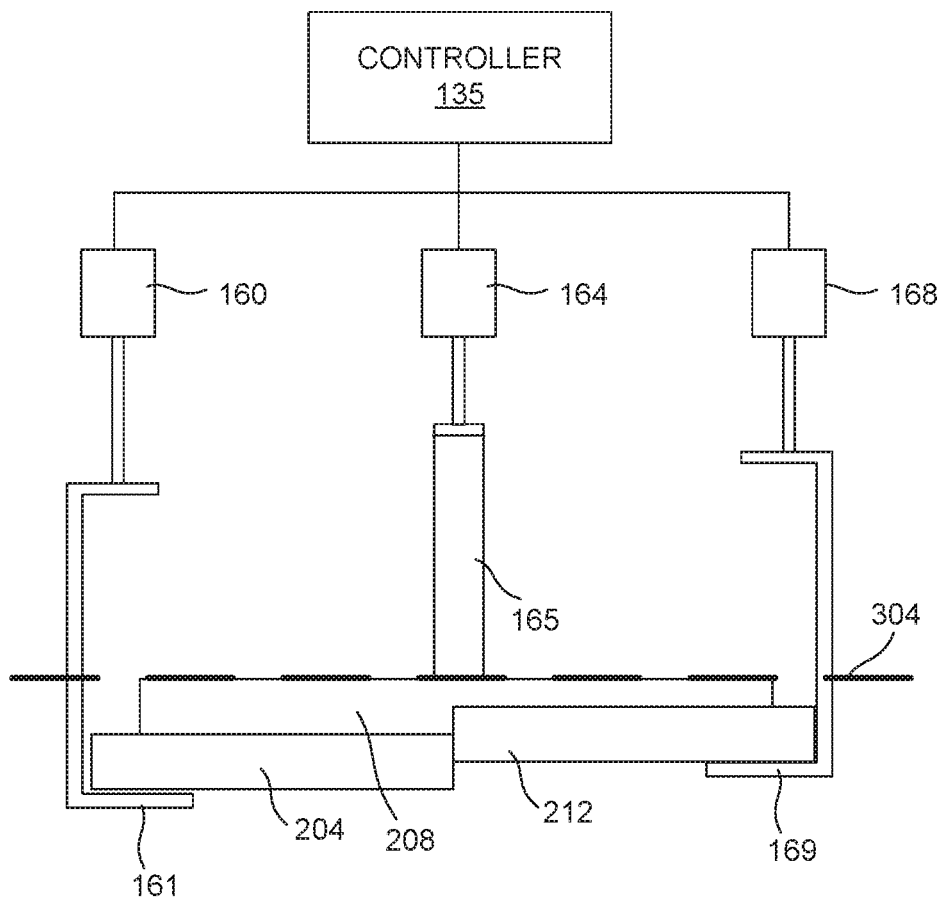
FIGS. 3A-C are side views of the pressure control ring system.

FIG. 3A is a side view of the pressure control ring system 125, which comprises the first segment 204, the second segment 208, and the third segment 212. Dashed line 304 shows the position of ends of the ports 121, so that when a surface of a segment is flush with the dashed line 304, ports adjacent to the segment are closed. In this first configuration, the second segment 208 is in a completely closed position being flush with the dashed line 304. The first segment 204 is in a completely open position and the third segment 212 is in a partially closed position between the completely open position and the completely closed position. This first position would cause most of the gas venting through ports 121 above the first segment 204 and some gas venting through ports 121 above the third segment 212 and no gas venting through ports 121 above the second segment 208.

Figure 4A:
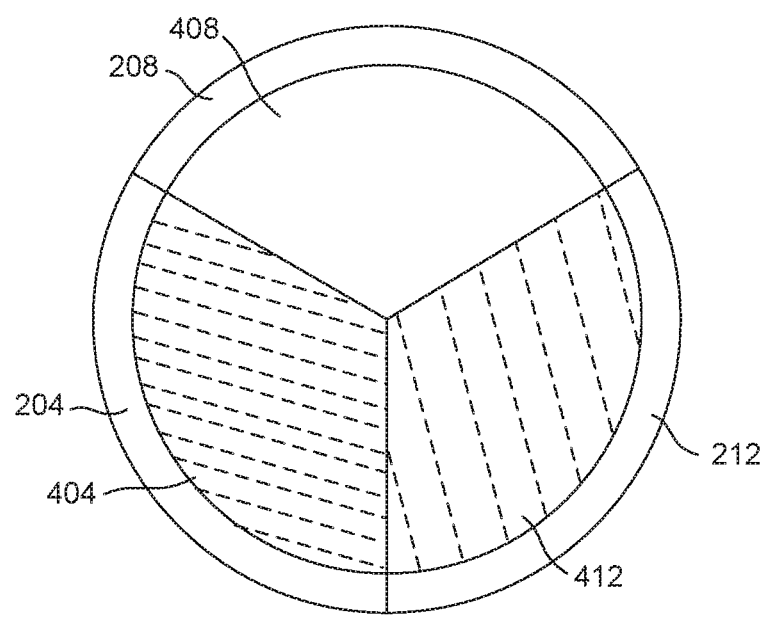
FIGS. 4A-C are schematic views of the plasma generation volume.

FIG. 4A is a schematic view of a first sector 404 of the plasma generation volume defined by the first segment 204, a second sector 408 of the plasma generation volume defined by the second segment 208, and a third sector 412 of the plasma generation volume defined by the third segment 212. The dashed lines in the first sector 404 show that more of the gas is vented through the first sector 404. The density of the dashed lines is less in the third sector 412 indicating a lower flow of gas vented through the third sector 412. The second sector 408 does not have any dashed lines, indicating that gas is not vented through the second sector 408.

Figure 3B:
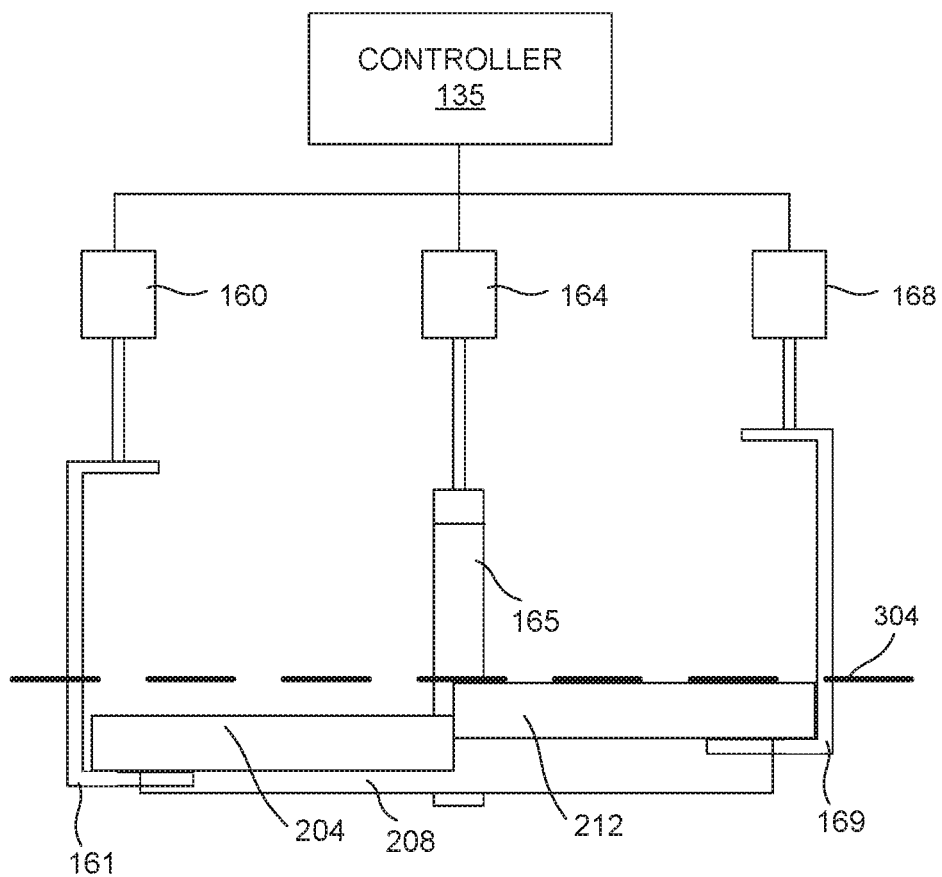

FIG. 3B is a side view of the pressure control ring system 125 in a second configuration. In this second configuration, the third segment 212 is in a completely closed position being flush with the dashed line 304. The second segment 208 is in a completely open position and the first segment 204 is in a partially closed position between the completely open position and the completely closed position. This second configuration would cause most of the gas venting through ports 121 above the second segment 208 and some gas venting through ports 121 above the first segment 204 and no gas venting through ports 121 above the third segment 212.

Figure 4B:
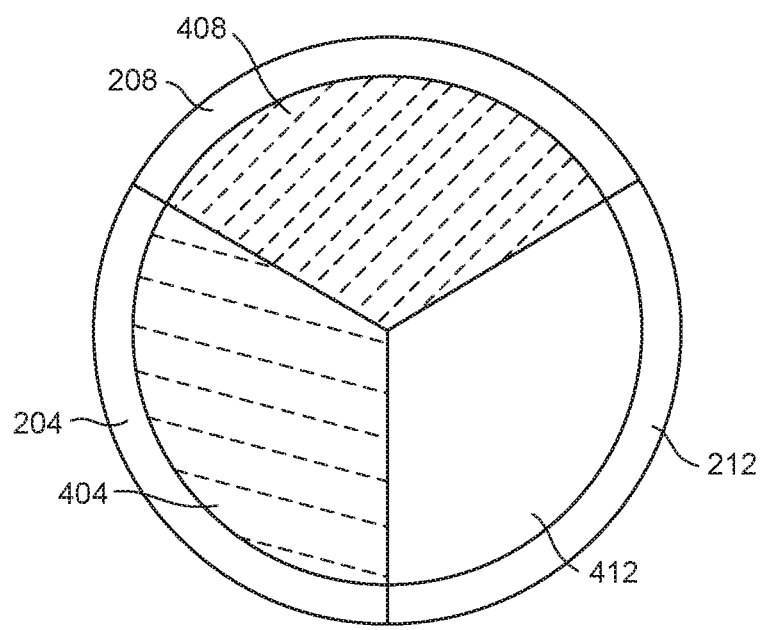

FIG. 4B is a schematic view of the first sector 404 of the plasma generation volume, the second sector 408 of the plasma generation volume, and the third sector 412 of the plasma generation volume in the second configuration. The dashed lines in the second sector 408 show that more of the gas is vented through the second sector 408. The density of the dashed lines is less in the first sector 404 indicating a lower flow of gas vented through the first sector 404. The third sector 412 does not have any dashed lines, indicating that gas is not vented through the third sector 412.

Figure 3C:
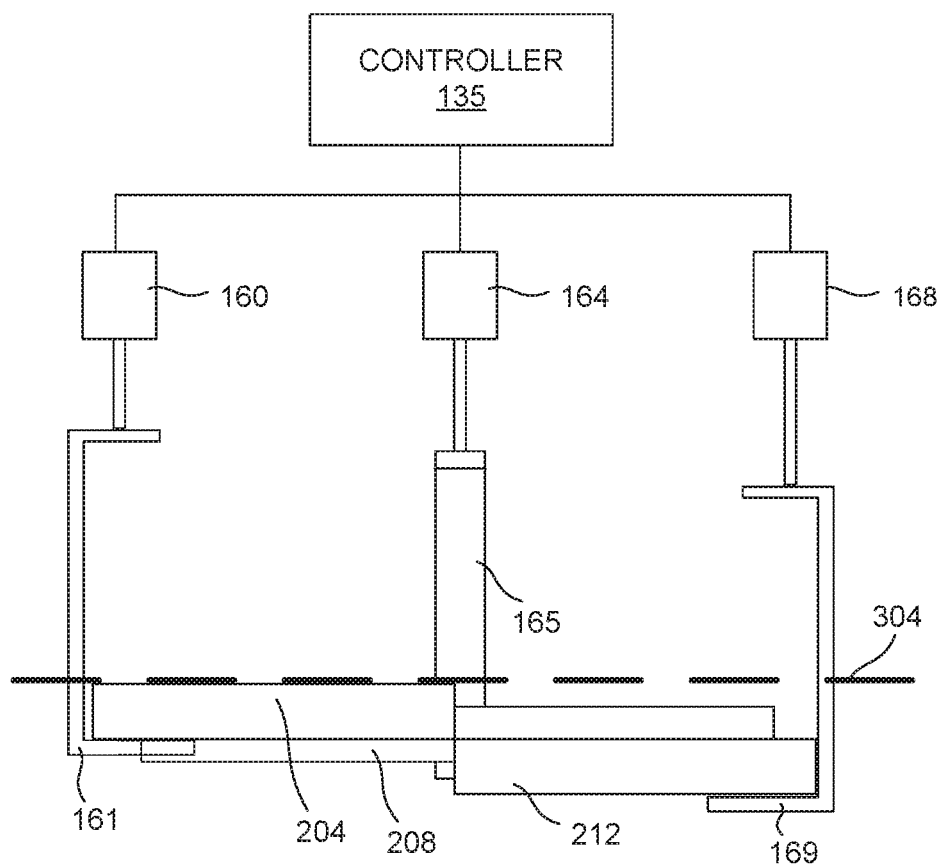

FIG. 3C is a side view of the pressure control ring system 125 in a third configuration. In this third configuration, the first segment 204 is in a completely closed position being flush with the dashed line 304. The third segment 212 is in a completely open position, and the second segment 208 is in a partially closed position between the completely open position and the completely closed position. This third position would cause most of the gas venting through ports 121 above the third segment 212 and some gas venting through ports 121 above the second segment 208 and no gas venting through ports 121 above the first segment 204.

Figure 4C:
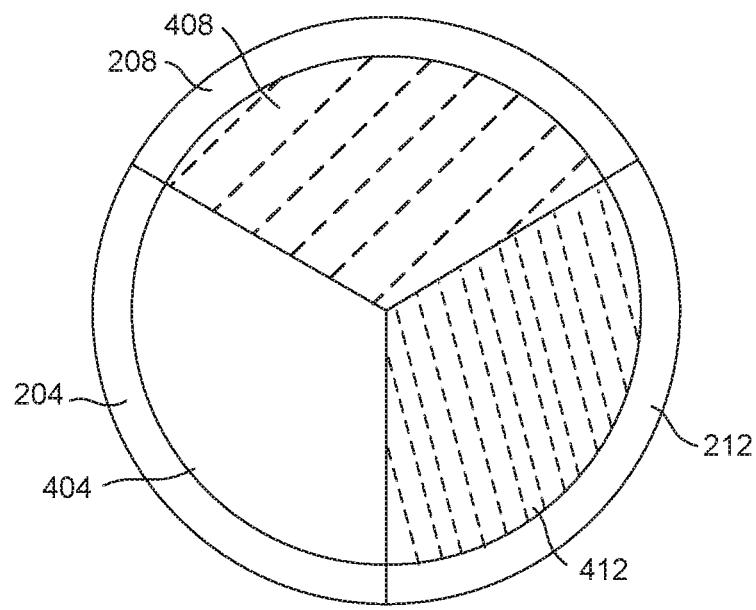

FIG. 4C is a schematic view of the first sector 404 of the plasma generation volume, the second sector 408 of the plasma generation volume, and the third sector 412 of the plasma generation volume in the third configuration. The dashed lines in the third sector 412 show that more of the gas is vented through the second sector 412. The density of the dashed lines is less in the second sector 408 indicating a lower flow of gas vented through the second sector 408. The first sector 404 does not have any dashed lines, indicating that gas is not vented through the first sector 404.

Figure 5:
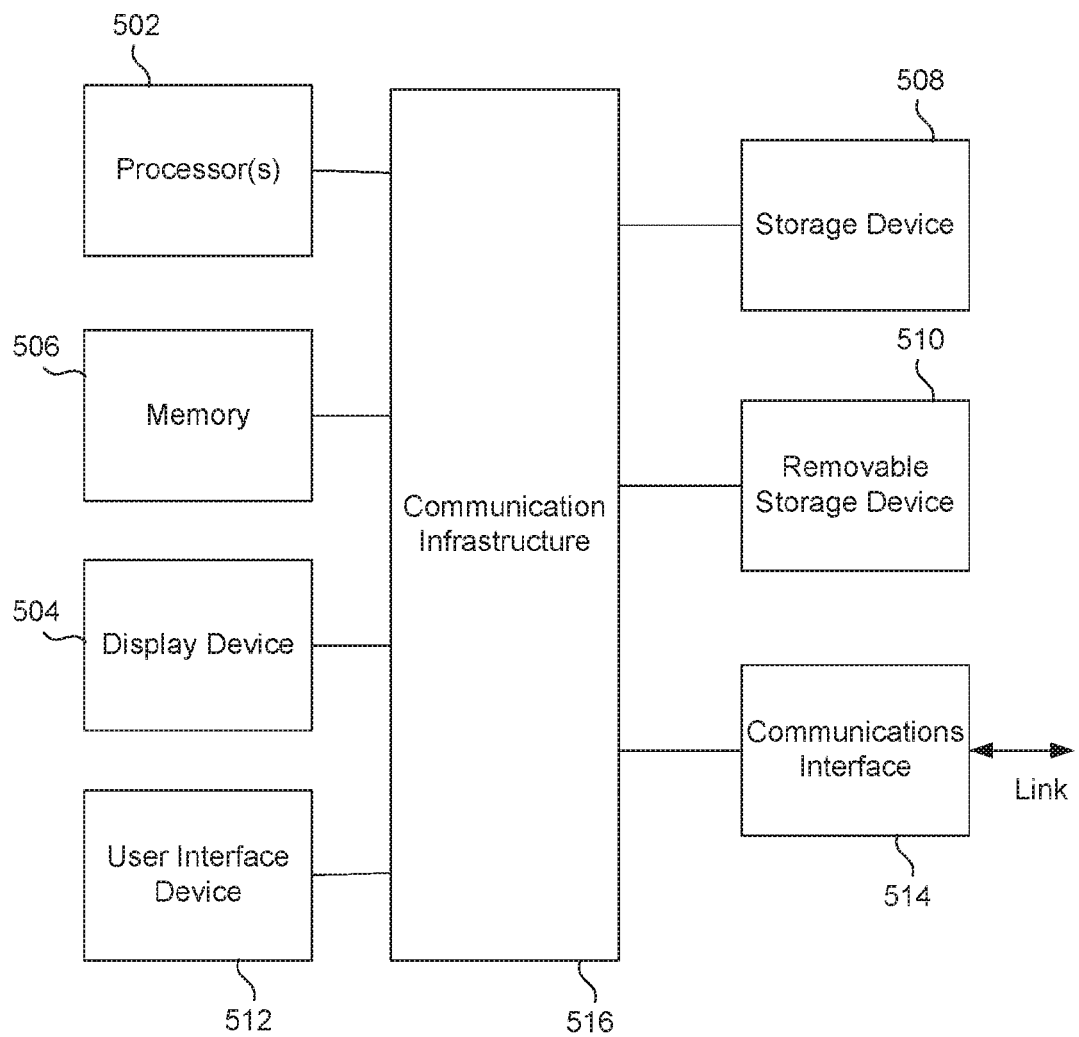
FIG. 5 illustrates a computer system, which is suitable for implementing a controller used in embodiments of the present invention.

FIG. 5 is a high level block diagram showing a computer system 500, which is suitable for implementing the controller 135 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

EXAMPLES

Figure 6:
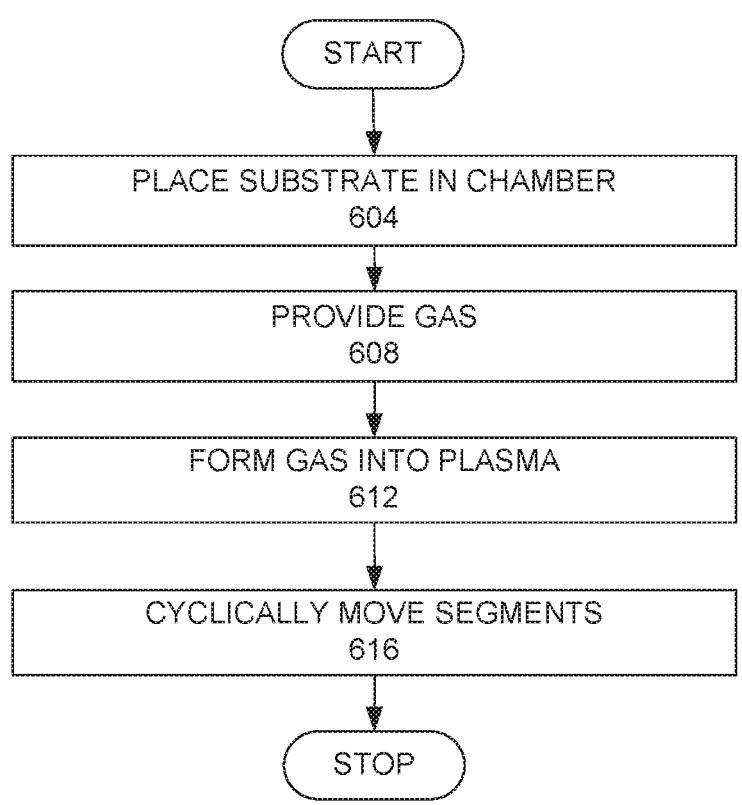
FIG. 6 is a high level flow chart of a process used in an embodiment of the invention.

In an example of the invention, FIG. 6 is a high level flow chart of a process used in an embodiment of the invention. A substrate 103, such as a wafer, is placed on the substrate holder 101 in the plasma processing chamber 100. A process gas is provided (step 608). The gas may be one or more component gases provided by the gas source 163. The gas may be constant or may vary over time, such as by varying cyclically. The gas is formed into a plasma (step 612). The plasma ring segments 204, 208, 212 are cyclically moved in order to azimuthally rotate venting of the plasma (step 616).

In a specific example of a recipe, a process gas is flowed from the gas source 163 into the plasma volume 105. RF power from either the upper electrode assembly 113 or the substrate holder 101 converts the process gas into a plasma. The first, second, and third segments 204, 208, 212 are sequentially opened and closed. In this example, during at least one phase only one segment is closed at any time. The other segments are either partially or fully open. In this example, each segment is closed every 10 seconds. This process is continued until the desired result, such as etching or deposition, is completed. Preferably, this process is carried out for at least one cycle. More preferably, the process is carried out for at least 5 cycles. More preferably, the process is carried out for 5 to 60 cycles. Then the flow of the process gas may be stopped.

This embodiment helps to avoid chemical non-uniformities that result from an azimuthally symmetric gas flow across the substrate, by providing alternating flow resistances with the pressure control ring segments 204, 208, 212 being sequenced through different positions in time. This dynamic approach to gas flow exhaust can make possible for different areas of the substrate to have similar time averaged residence times (or flow), to provide better time averaged chemical uniformity. In this embodiment, gas is flowed through the different sectors for equal amounts of time. In other embodiment, the gas is flowed through the different sectors at unequal amounts of time. In some embodiments the unequal amounts of time results in unequal time averages. Different embodiments may be used for one or more various processes for processing a substrate, which includes processing a stack on the substrate. Such processes may be for etching or deposition. Such depositions may be physical vapor deposition (PVD), chemical vapor deposition (CVD), or atomic layer deposition (ALD).

Figure 7:
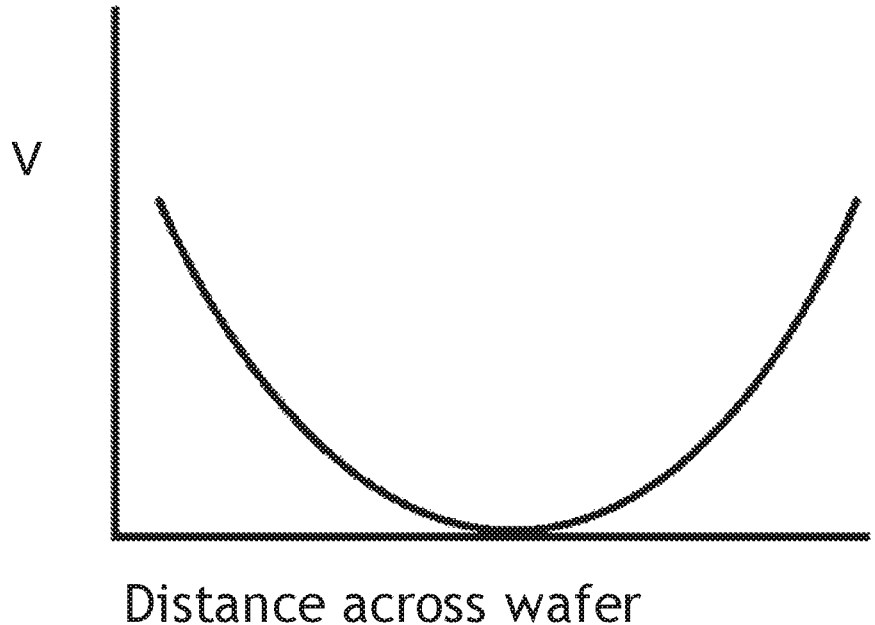
FIG. 7 is a graph of the radial field velocity of the flow of gas or plasma for prior art devices.
Figure 8:
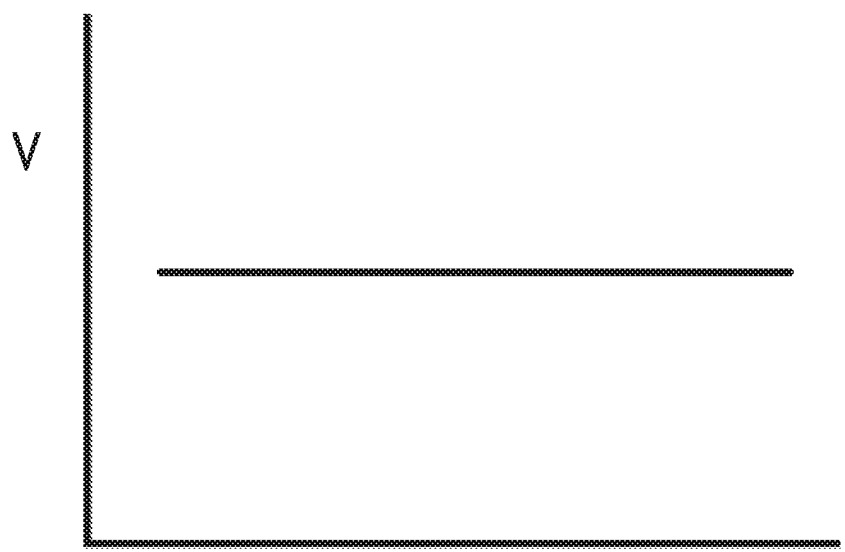
FIG. 8 is a graph of a time average radial field velocity of the flow of gas or plasma with the present embodiment.

Non-uniform semiconductor substrate processing can be driven by spatial variation of RF power (e.g., plasma density in a vacuum chamber of a plasma processing apparatus), temperature (e.g., the temperature across an upper surface of a semiconductor substrate being processed or surrounding chamber parts), and/or chemical species (including activated and non-activated molecules and byproducts from chemical reactions and chemical nonuniformity). Embodiments of methods disclosed herein improve chemical uniformity during processing of semiconductor substrates such that semiconductor substrates are more uniformly processed (e.g., plasma etched). In this embodiment, chemical uniformity is improved by cyclically varying an azimuthal venting. FIG. 7 is a graph of the radial field velocity of the flow of gas or plasma for prior art devices using a single pressure control ring. As indicated in FIG. 7 the velocity decreases going from a side of a substrate to the center of the substrate and then increases going from the center of the substrate to the opposite side of the substrate. FIG. 8 is a graph of a time average radial field velocity of the flow of gas or plasma with the present embodiment. The velocity is approximately the same on the sides of the wafer as in the center of the wafer. Different timing schemes of opening and closing the segments provide another control parameter to adjust the mean velocity profile. This control parameter may be used to provide other results such as non-uniform azimuthal control or providing an asymmetric effect.

Gas injected through the center of the showerhead toward the center of a semiconductor substrate has a longer residence time than gas injected radially outward from the center of the showerhead. The longer residence time occurs because gas must move radially outward from the center of the semiconductor substrate across the upper surface of the semiconductor substrate wherein the gas is removed from the vacuum chamber by a vacuum pump. Because the gas needs to flow to the edge of the semiconductor substrate to thereby be removed from the vacuum chamber, there is also a higher fraction of byproducts at the edge of the semiconductor substrate than at portions of the semiconductor substrate radially inward of the edge thereof.

Since this embodiment provides non-symmetrical gas flow, different areas across the upper surface of a semiconductor substrate being processed have similar or equal time average residence times (or gas flow) there across, and therefore better time averaged chemical uniformity and a uniform mean velocity field. Preferably the discrete sectors are arranged around the center of the plasma processing chamber.

The semiconductor substrate processing apparatus can be a plasma processing apparatus such as a low-density, medium-density or high-density plasma reactor including an energy source that uses RF energy, microwave energy, magnetic fields, or the like to produce plasma. For example, the high-density plasma can be produced in a transformer coupled plasma (TCP™) reactor, also known as an inductively coupled plasma chamber, an electron-cyclotron resonance (ECR) plasma reactor, a capacitive-type discharge reactor, a capacitively coupled plasma processing chamber or the like. Exemplary plasma reactors that embodiments of the gas supply delivery arrangement can be used with include Exelan™ plasma reactors, such as the 2300 Excelan™ plasma reactor, available from Lam Research Corporation, located in Fremont, Calif. In an embodiment, a plasma processing system as disclosed herein can include a vacuum chamber which is an inductively coupled plasma processing chamber in which the gas injection system is a gas distribution plate, or alternatively, the chamber is a capacitively coupled plasma processing chamber in which the gas injection system may be a showerhead electrode. As used herein, the term "showerhead" may refer to a showerhead electrode or a gas distribution plate. During plasma etching processes, multiple frequencies can be applied to a substrate support incorporating an electrode and an electrostatic chuck. Alternatively, in dual RF source feed plasma reactors, different frequencies can be applied to the substrate support and showerhead electrode spaced from the semiconductor substrate so as to define a plasma generation region.

The number of gas sources included in the gas source 163 is not limited to any particular number of gas sources, but preferably includes at least two different gas sources. For example, the gas source 163 can include more than or less than eight gas sources, such as up to 17 gas sources. The different gases that can be provided by the respective gas sources include individual gases, such as $O_2$, Ar, $H_2$, $Cl_2$, $N_2$ and the like, as well as gaseous fluorocarbon and/or fluorohydrocarbon compounds, such as $CF_4$, $CH_3F$ and the like. In an embodiment, the process chamber is a plasma processing etch chamber and the gas source 163 can supply Ar, $O_2$, $N_2$, $Cl_2$, $CH_3$, $CF_4$, $C_4F_8$ and $CH_3F$ or $CHF_3$ (in any suitable order thereof). The particular gases supplied by the gas source 163 can be selected based on the desired process that is to be performed in the plasma processing chamber, which is determined by the particular material composition of an upper surface of the semiconductor substrate to be processed, e.g., a particular dry etching and/or material deposition process. The gas source 163 can provide broad versatility regarding the choice of gases that can be supplied for performing etching processes. The gas source 163 preferably also includes at least one tuning gas source to adjust the gas composition. The tuning gas can be, e.g., $O_2$, an inert gas, such as argon, or a reactive gas, such as a fluorocarbon or fluorohydrocarbon gas, e.g., $C_4F_8$.

The pressure control ring segments 204, 208, 212, the motors 160, 164, 168, and hangars 161, 165, 169 with the ports 121 form an exhaust pressure system in this embodiment, which exhausts gas around a periphery of the substrate. In this embodiment the exhaust pressure system is divided into three parts, which control the velocity of the gas over the substrate and provides independent exhaust pressure control for each part of the periphery for the three parts. This embodiment provides a controller for azimuthally, cyclically, and sequentially changing the pressure for each of the three parts.

Other embodiments may use other variations of moving the plasma ring segments 204, 208, 212. For example, in another embodiment one segment may be open while two other segments are completely closed. The open segment may be cyclically rotated. In another embodiment, the open segment may not be cyclically rotated, but may follow another cyclical continuous pattern. In another embodiment, two segments may be completely open at one time and the other segment is completely closed. The open segments may be rotated or may follow another cyclical pattern.

In other embodiments, the pressure control ring is formed by four segments. In one such embodiment, two adjacent segments are open at a time. In another embodiment, one segment is open at a time, and the open segment is cyclically rotated around the substrate. In such embodiments, the four segments form an exhaust pressure system, which exhausts gas around a periphery of the substrate. The exhaust pressure system is divided into four parts, which control the velocity of the gas over the substrate and provides independent exhaust pressure control for each part of the periphery for the four parts.

Other embodiments may have other drive systems. For example, the hangers may be replaced with other devices to connect the segments to motors. The three separate motors may be replaced with one or more motors. Each segment may use two motors for improved control. Other pressure sensors, such as optical devices, may be used.

In different embodiments, cycle frequency is dependent on residence times of the gases. Preferably in a cyclical process, each cycle is repeated in less than 30 seconds, which means that the segments would be alternately closed and a particular segment would be open and then closed within 30 seconds. More preferably, each cycle is repeated every 1-20 seconds. Most preferably, each cycle is repeated every 5 to 15 seconds. By controlling pressure, velocity is controlled. In another embodiment, a static segment configuration may be used for a process. In such a process, all of the segments are placed in a static position, where at least one segment is more open than another segment. The different amounts of openness causes the segments to provide different pressure. These different pressures may provide another control, which may be used to improve uniformity or another feature. A substrate in a plasma processing chamber may be subjected to a plurality of different processes. In some embodiments, at least one process may use a cyclical opening of the segments and another process may use a static positioning of the segments. In another embodiment, the segments may be in a static position for one process and then moved to another static position for another process.

In some embodiments, a layer to be etched is a dielectric layer, such as silicon oxide or a low-k dielectric material. In other embodiments, a layer to be etched is a metal containing layer, or a conductive layer, or a silicon layer, such as a silicon wafer.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for processing a substrate, comprising
a processing chamber;
a substrate support for supporting the substrate within the processing chamber;
a gas inlet for providing gas into the processing chamber;
an exhaust pressure system, which exhausts gas around a periphery of the substrate, wherein the periphery around the substrate is divided into at least three parts, wherein the exhaust pressure system controls exhaust pressure to control a velocity of the gas over the substrate, wherein the exhaust pressure system provides an independent exhaust pressure control for each part of the periphery for the at least three parts, wherein the exhaust pressure system comprises:
a plurality of exhaust ports spaced around the periphery of the substrate;
a segmented pressure ring formed by at least three segments, wherein the segmented pressure ring is placed adjacent to the plurality of exhaust ports around the periphery of the substrate; and
a drive system, wherein the drive system is able to independently move each segment to allow a segment to be in a closed position while another segment is in an open position; and
an exhaust pressure controller controllably connected to the drive system for azimuthally, cyclically, and sequentially changing the pressure for each part, wherein the exhaust pressure controller comprises non-transient computer readable media, comprising computer readable code for controlling the drive system to cyclically and sequentially move each segment of the at least three segments to provide an azimuthally rotating venting.

2. The apparatus, as recited in claim 1, further comprising:
pressure sensors connected to the processing chamber; and
a feedback loop connected to the pressure sensors and the exhaust pressure controller, for providing feedback to the pressure controller.

3. The apparatus as recited in claim 2, wherein the pressure sensors are manometers.

4. The apparatus, as recited in claim 3, further comprising two electrodes for forming a plasma within the processing chamber.

5. The apparatus, as recited in claim 1, further comprising:
pressure sensors connected to the processing chamber; and
a feedback loop connected to the pressure sensors and the exhaust pressure controller, for providing feedback to the pressure controller.

6. The apparatus as recited in claim 5, wherein the pressure sensors are manometers.

7. The apparatus, as recited in claim 1, wherein the non-transient computer readable media further comprises computer readable code for controlling the drive system to move the segments to open and closed positions, so that at least one segment is open when at least another segment is closed.

8. The apparatus, as recited in claim 1, further comprising two electrodes for forming a plasma within the processing chamber.

* * * * *